United States Patent
Zheng et al.

(10) Patent No.: US 11,125,840 B2
(45) Date of Patent: Sep. 21, 2021

(54) ULTRA-LOW RA AND HIGH TMR MAGNETIC SENSOR WITH RADIATION REFLECTIVE LEAD

(71) Applicant: Western Digital Technologies, Inc., San Jose, CA (US)

(72) Inventors: Yuankai Zheng, Fremont, CA (US); Christian Kaiser, San Jose, CA (US); Zhitao Diao, Fremont, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/794,100

(22) Filed: Feb. 18, 2020

(65) Prior Publication Data
US 2021/0255256 A1    Aug. 19, 2021

(51) Int. Cl.
  *G11B 5/39*        (2006.01)
  *G01R 33/09*       (2006.01)
  *G01R 33/00*       (2006.01)

(52) U.S. Cl.
  CPC ....... *G01R 33/098* (2013.01); *G01R 33/0023* (2013.01); *G01R 33/0082* (2013.01); *G11B 5/3909* (2013.01); *G11B 5/3912* (2013.01)

(58) Field of Classification Search
  None
  See application file for complete search history.

(56) References Cited

U.S. PATENT DOCUMENTS

| | | | |
|---|---|---|---|
| 6,381,094 B1 * | 4/2002 | Gill | B82Y 10/00 360/125.3 |
| 6,452,761 B1 * | 9/2002 | Carey | B82Y 10/00 29/603.13 |
| 6,724,587 B2 * | 4/2004 | Gill | B82Y 10/00 360/324.2 |
| 7,064,934 B2 | 6/2006 | Mao et al. | |
| 7,780,820 B2 | 8/2010 | Zhao et al. | |
| 8,107,202 B2 | 1/2012 | Lee et al. | |
| 8,289,663 B2 | 10/2012 | Zhang et al. | |
| 8,378,330 B2 | 2/2013 | Horng et al. | |
| 9,093,639 B2 | 7/2015 | Kaiser et al. | |
| 9,577,184 B2 | 2/2017 | Zhao et al. | |
| 9,842,637 B2 | 12/2017 | Kim et al. | |
| 10,211,396 B2 | 2/2019 | Kim et al. | |

(Continued)

OTHER PUBLICATIONS

International Search Report and Written Opinion issued in corresponding International Patent Application No. PCT/US2020/034797, dated Aug. 17, 2020 (7 pages).

(Continued)

*Primary Examiner* — Jefferson A Evans
(74) *Attorney, Agent, or Firm* — Patterson & Sheridan LLP; Steven H. Versteeg (57) ABSTRACT

The present disclosure generally relates to a tunnel magnetoresistive (TMR) device. The TMR device includes a high radiation reflective layer between the bottom shield of the TMR device and the magnetic seed layer. The high radiation reflective layer helps to maintain the TMR device temperature during transportation between processing chambers. Additionally, the high radiation reflective layer decreases the resistance area (RA) of the TMR device while also increasing the magnetoresistance (MR) of the TMR device.

22 Claims, 8 Drawing Sheets

(56) References Cited

U.S. PATENT DOCUMENTS

| | | | |
|---|---|---|---|
| 2002/0186515 A1* | 12/2002 | Gill | B82Y 25/00 360/324.2 |
| 2004/0101978 A1* | 5/2004 | Linn | G01R 33/06 438/3 |
| 2005/0286178 A1* | 12/2005 | Gill | G11B 5/314 360/324.2 |
| 2006/0171081 A1* | 8/2006 | Brcuer | G01R 33/0206 360/313 |
| 2007/0154630 A1 | 7/2007 | Kim et al. | |
| 2007/0277910 A1 | 12/2007 | Ochiai et al. | |
| 2008/0259507 A1* | 10/2008 | Lin | B82Y 25/00 360/324.1 |
| 2009/0116137 A1* | 5/2009 | Takekuma | G11B 5/66 360/75 |
| 2011/0096443 A1* | 4/2011 | Zhang | G01R 33/098 360/324.2 |
| 2012/0257298 A1* | 10/2012 | Sato | G11B 5/3909 360/75 |
| 2013/0244192 A1* | 9/2013 | He | G01R 33/093 432/9 |
| 2014/0252518 A1* | 9/2014 | Zhang | G01R 33/093 257/422 |
| 2016/0320460 A1 | 11/2016 | Mather et al. | |
| 2017/0301855 A1* | 10/2017 | Zhang | H01L 43/08 |
| 2017/0309301 A1* | 10/2017 | Takahashi | G11B 5/3133 |

OTHER PUBLICATIONS

Kobayashi et al.; "TMR Film and Head Technologies"; Fujitsu Sci. Tech. J., 42, 1, pp. 139-148; Jan. 2006 (10 pages).

* cited by examiner

ULTRA-LOW RA AND HIGH TMR MAGNETIC SENSOR WITH RADIATION REFLECTIVE LEAD

BACKGROUND OF THE DISCLOSURE

Field of the Disclosure

Embodiments of the present disclosure generally relate to a tunnel magnetoresistive (TMR) device.

Description of the Related Art

There is a trend in magnetic recording to achieve higher areal densities. A lower track width (TW) is desired for higher areal density medias. Keeping the head signal-to-noise (SNR) higher is necessary for a smaller TW. In order to have a high SNR, a larger magnetoresistance (MR) and lower resistance area (RA) is necessary.

In order to increase the TMR, cryogenic cooling is used to cool the free layer of the TMR sensor. A lower deposition temperature is good for amorphous free layer deposition, but in order to keep the substrate cool, short transport times between a cooling chamber and the free layer deposition chamber is preferred. However, the substrate temperature will heat up during the transfer from the cryogenic cooling chamber to the deposition chamber.

Therefore, there is a need in the art for a way to maintain substrate temperature during transport between chambers.

SUMMARY OF THE DISCLOSURE

The present disclosure generally relates to a tunnel magnetoresistive (TMR) device. The TMR device includes a high radiation reflective layer between the bottom shield of the TMR device and the magnetic seed layer. The high radiation reflective layer helps to maintain the TMR device temperature during transportation between processing chambers. Additionally, the high radiation reflective layer decreases the resistance area (RA) of the TMR device while also increasing the magnetoresistance (MR) of the TMR device.

In one embodiment, a TMR sensor device comprises: a first shield; a reflective layer disposed on the first shield; a magnetic seed layer disposed on the reflective layer, wherein the magnetic seed layer is distinct from the reflective layer and wherein the magnetic seed layer comprises one or more sublayers; a TMR sensor disposed on the magnetic seed layer; and a second shield disposed on the TMR sensor.

In another embodiment, a TMR sensor device comprises: a first layer comprising copper, silver, gold, or combinations thereof; a multilayer seed structure comprising at least one layer of copper that is distinct from the first layer, wherein the first layer has a thickness that is greater than a thickness of the at least one layer of copper in the multilayer seed structure, wherein the multilayer seed structure is disposed on the first layer; and a TMR sensor disposed on the multilayer seed structure.

In another embodiment, a TMR sensor device comprises: a first shield; means to stabilize a temperature of the TMR sensor device, wherein the means to stabilize a temperature of the TMR sensor device is disposed on the first shield; a magnetic seed layer disposed on the means to stabilize the temperature of the TMR sensor device; a TMR sensor disposed on the magnetic seed layer; and a second shield disposed on the TMR sensor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to a tunnel magnetoresistive (TMR) device. The TMR device includes a high radiation reflective layer between the bottom shield of the TMR device and the magnetic seed layer. The high radiation reflective layer helps to maintain the TMR device temperature during transportation between processing chambers. Additionally, the high radiation reflective layer decreases the resistance area (RA) of the TMR device while also increasing the magnetoresistance (MR) of the TMR device.

Figure 1:
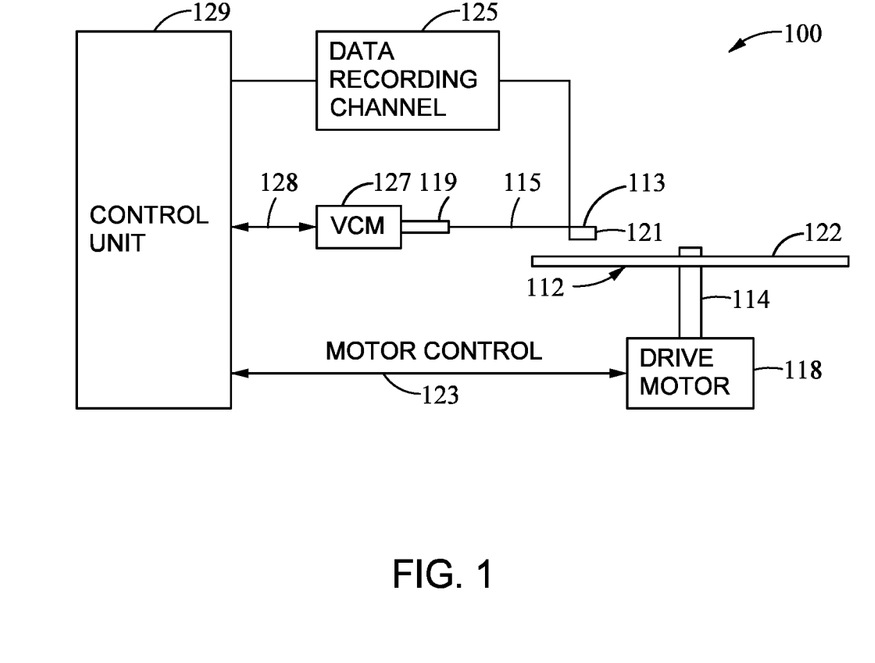
FIG. 1 is a schematic illustration of a magnetic media device according to one embodiment.

FIG. 1 is a schematic illustration of a magnetic media device according to one embodiment. Such a data storage device may be a single drive/device or comprise multiple drives/devices. For the sake of illustration, a single disk drive 100 is shown according to one embodiment. As shown, at least one rotatable magnetic disk 112 is supported on a spindle 114 and rotated by a drive motor 118. The magnetic recording on each magnetic disk 112 is in the form of any suitable patterns of data tracks, such as annular patterns of concentric data tracks (not shown) on the magnetic disk 112.

At least one slider 113 is positioned near the magnetic disk 112, each slider 113 supporting one or more magnetic head assemblies 121. As the magnetic disk 112 rotates, the slider 113 moves radially in and out over the disk surface 122 so that the magnetic head assembly 121 may access different tracks of the magnetic disk 112 where desired data are written. Each slider 113 is attached to an actuator arm 119 by way of a suspension 115. The suspension 115 provides a slight spring force which biases the slider 113 toward the disk surface 122. Each actuator arm 119 is attached to an actuator means 127. The actuator means 127 as shown in FIG. 1 may be a voice coil motor (VCM). The VCM includes a coil movable within a fixed magnetic field, the direction and speed of the coil movements being controlled by the motor current signals supplied by control unit 129.

During operation of the disk drive 100, the rotation of the magnetic disk 112 generates an air bearing between the slider 113 and the disk surface 122 which exerts an upward force or lift on the slider 113. The air bearing thus counterbalances the slight spring force of suspension 115 and supports slider 113 off and slightly above the disk surface 122 by a small, substantially constant spacing during normal operation.

The various components of the disk drive 100 are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads on the assembly 121 by way of recording channel 125.

The above description of a typical magnetic media device and the accompanying illustration of FIG. 1 are for representation purposes only. It should be apparent that magnetic media devices may contain a large number of media, or disks, and actuators, and each actuator may support a number of sliders.

Figure 2:
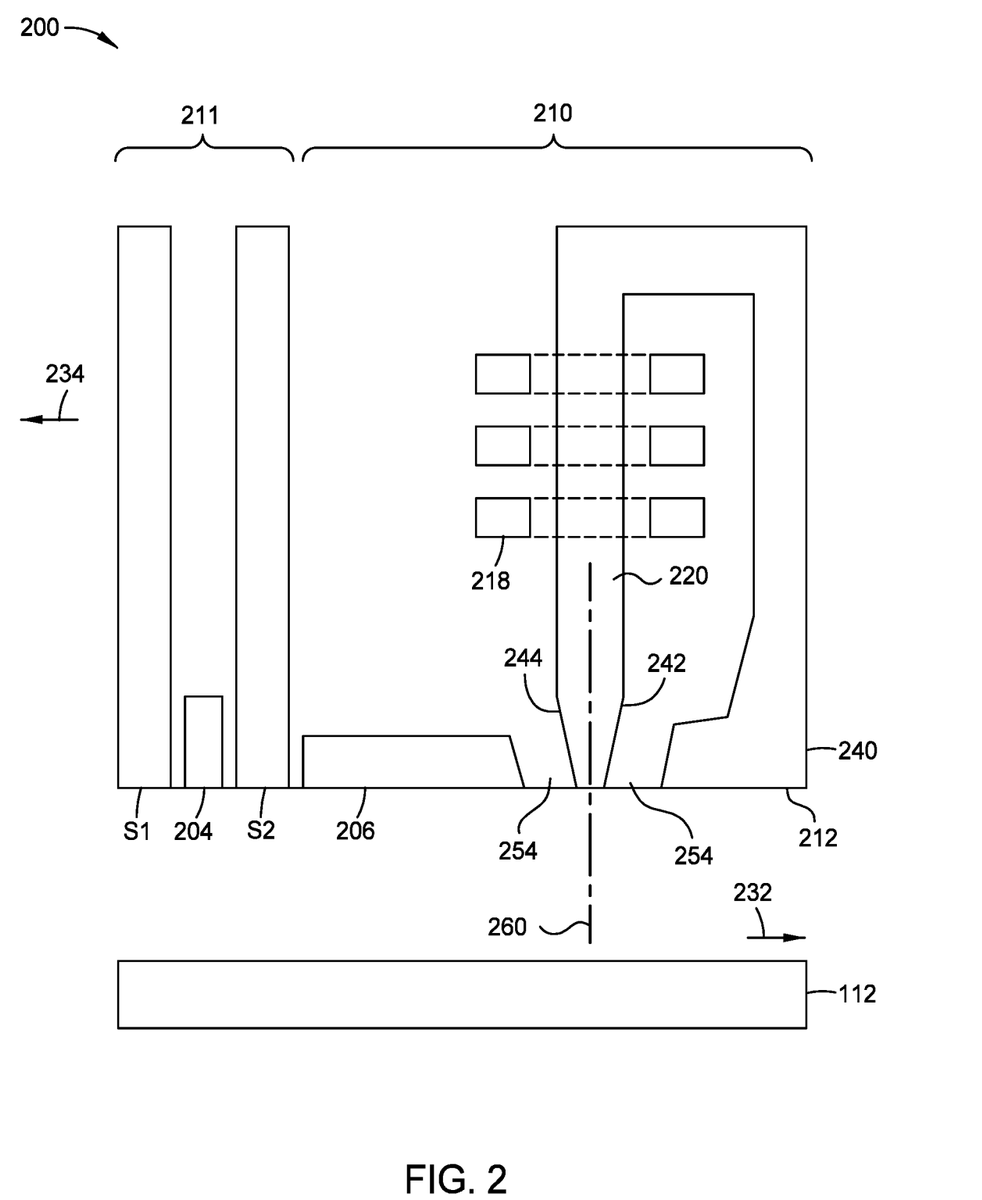
FIG. 2 is a fragmented, cross-sectional side view of a read/write head facing a magnetic disk according to one embodiment.

FIG. 2 is a fragmented, cross-sectional side view of a read/write head facing a magnetic disk according to one embodiment. The read/write head 200 may correspond to the magnetic head assembly 121 described in FIG. 1. The read/write head 200 includes a MFS 212, such as an air bearing surface (ABS), facing the disk 112, a magnetic write head 210, and a magnetic read head 211. As shown in FIG. 2, the magnetic disk 112 moves past the write head 210 in the direction indicated by the arrow 232 and the read/write head 200 moves in the direction indicated by the arrow 234.

In some embodiments, the magnetic read head 211 is a magnetoresistive (MR) read head that includes an MR sensing element 204 located between MR shields S1 and S2. In other embodiments, the magnetic read head 211 is a magnetic tunnel junction (MTJ) read head that includes a MTJ sensing device 204 located between MR shields S1 and S2. The magnetic fields of the adjacent magnetized regions in the magnetic disk 112 are detectable by the MR (or MTJ) sensing element 204 as the recorded bits. The magnetic read head 211 may include one or more of the TMR sensor embodiments as further described below.

The write head 210 includes a main pole 220, a leading shield 206, a trailing shield 240, and a coil 218 that excites the main pole 220. The coil 218 may have a "pancake" structure which winds around a back-contact between the main pole 220 and the trailing shield 240, instead of a "helical" structure shown in FIG. 2. The dielectric material 254 is also disposed between the leading shield 206 and the main pole 220. The main pole 220 includes a trailing taper 242 and a leading taper 244. The trailing taper 242 extends from a location recessed from the MFS 212 to the MFS 212. The leading taper 244 extends from a location recessed from the MFS 212 to the MFS 212. The trailing taper 242 and the leading taper 244 may have the same degree of taper, and the degree of taper is measured with respect to a longitudinal axis 260 of the main pole 220. In some embodiments, the main pole 220 does not include the trailing taper 242 and the leading taper 244. Instead, the main pole 220 includes a trailing side (not shown) and a leading side (not shown), and the trailing side and the leading side are substantially parallel. The main pole 220 may be a magnetic material such as a FeCo alloy. The leading shield 206 and the trailing shield 240 may be a magnetic material, such as NiFe alloy.

Figure 3:
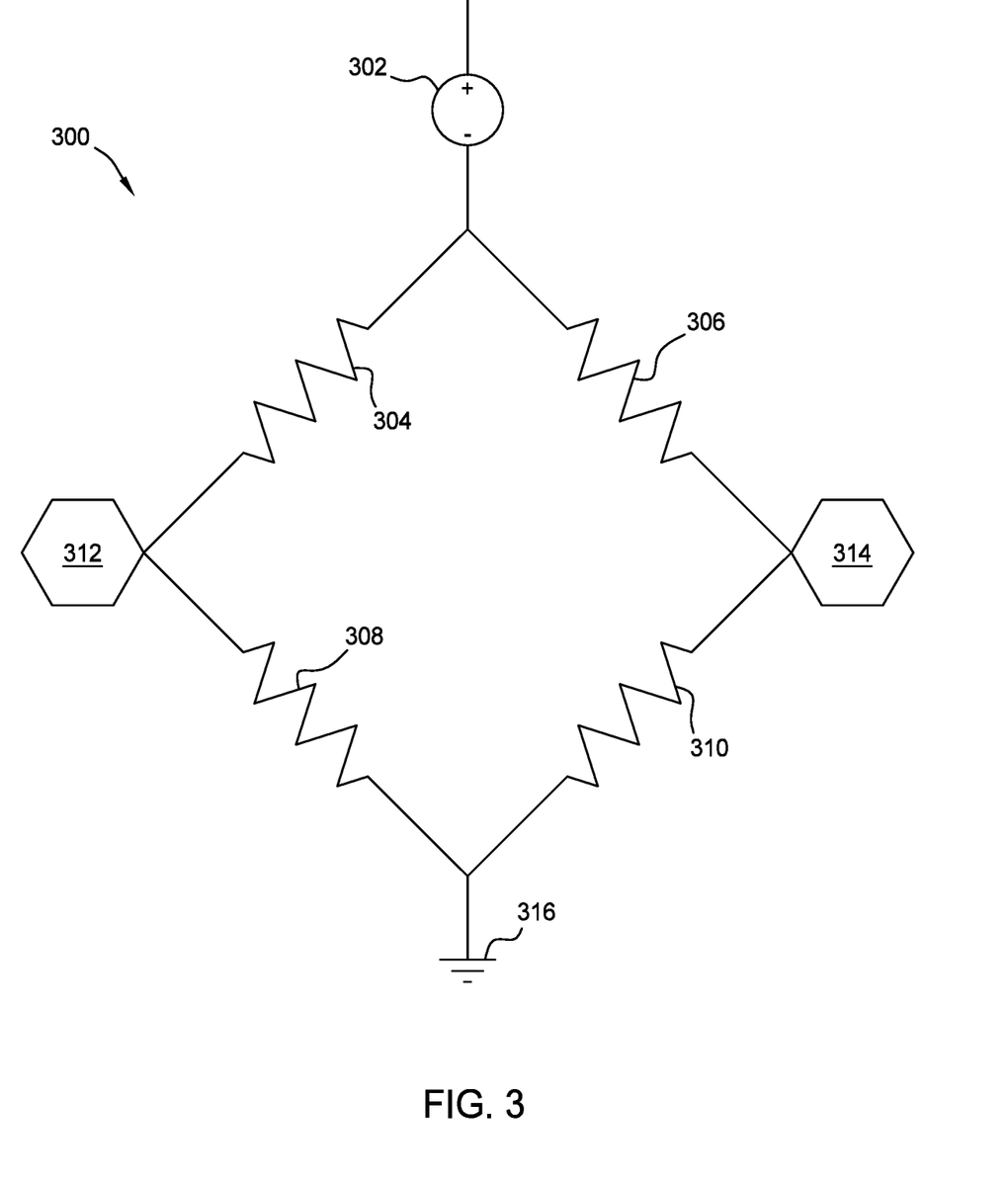
FIG. 3 is a schematic illustration of a Wheatstone bridge design.

FIG. 3 is a schematic illustration of a Wheatstone bridge design. The bridge 300 includes a bias source 302, a first resistor 304, a second resistor 306, a third resistor 310, a fourth resistor 308, a first output pad 312, a second output pad 314, and a ground connection 316. Bias voltage is applied across the bridge from the bias source 302 to the ground connection 316. The bridge output is the potential difference across the first output pad 312 and the second output pad 314. Any change in resistance due to temperature variation from the resistors 304, 306, 308, 310 is nullified due to the nature of differential output.

As discussed herein, the resistors 304, 306, 308, 310 each is made of at least one TMR film. In one embodiment, the TMR films are each distinct and different such that the resistors 304, 306, 308, 310 have different resistance. In another embodiment, the TMR films are identical, but the resistors 304, 306, 308, 310 are different. In still another embodiment, resistors 304, 310 are identical to each other (as are the TMR films that the resistors 304, 310 are made of), and resistors 306, 308 are identical to each other (as are the TMR films that the resistors 306, 308 are made of) yet different from resistors 304, 310.

Typical magnetic field sensors use TMR resistors in a Wheatstone bridge circuit. The TMR resistors have to have different responses to the magnetic field in order to generate the differential output voltage. The reliability and performance of the TMR films determines the magnetoresistance response. In this way, combined with different TMR films features, a perfect Wheatstone bridge design for magnetic field sensor can be fabricated.

In regards to FIG. 3, if the free layer of the TMR films that the resistors 304, 306, 308, 310 are made of has a long axis of +45° or −45° to the pinned layer magnetization direction, then the free layer easy axis is restricted to be along the long axis due to the shape anisotropy, and the magnetization direction can be set bidirectional along the long axis by an ampere field from the set line which is sitting on top of the free layer and orthogonal to the free layer long axis.

When applying a magnetic field along the Y-axis, the resistances of 310 and 304 are increasing while the resistances of 306, 308 are decreasing with the field. This different response enables the Wheatstone bridge, and the sensor sensitivity is proportional to the output voltage which is proportional to the resistance difference between resistor 310 (or resistor 304) and resistor 306 (or resistor 308). However, only half of the magnetoresistance change is used due to the 45° free layer or pinned layer initial state. If the free layer to pinned layer initial magnetization state can be set to 90° and still have two different magnetoresistance changes, full range of magnetoresistance change will be used and the sensor sensitivity can be increased by a factor of two.

The pinned layer magnetization direction is set by magnetic annealing direction. Usually resistors 304, 306, 308, 310 are made by the same TMR film and experience the same processes, and therefore all have the same pinned layer direction. Each device can operate in full magnetic resistance (MR) ratio, but all the devices respond to the external field in the same way and consequently there is no output voltage at all.

Figure 4:
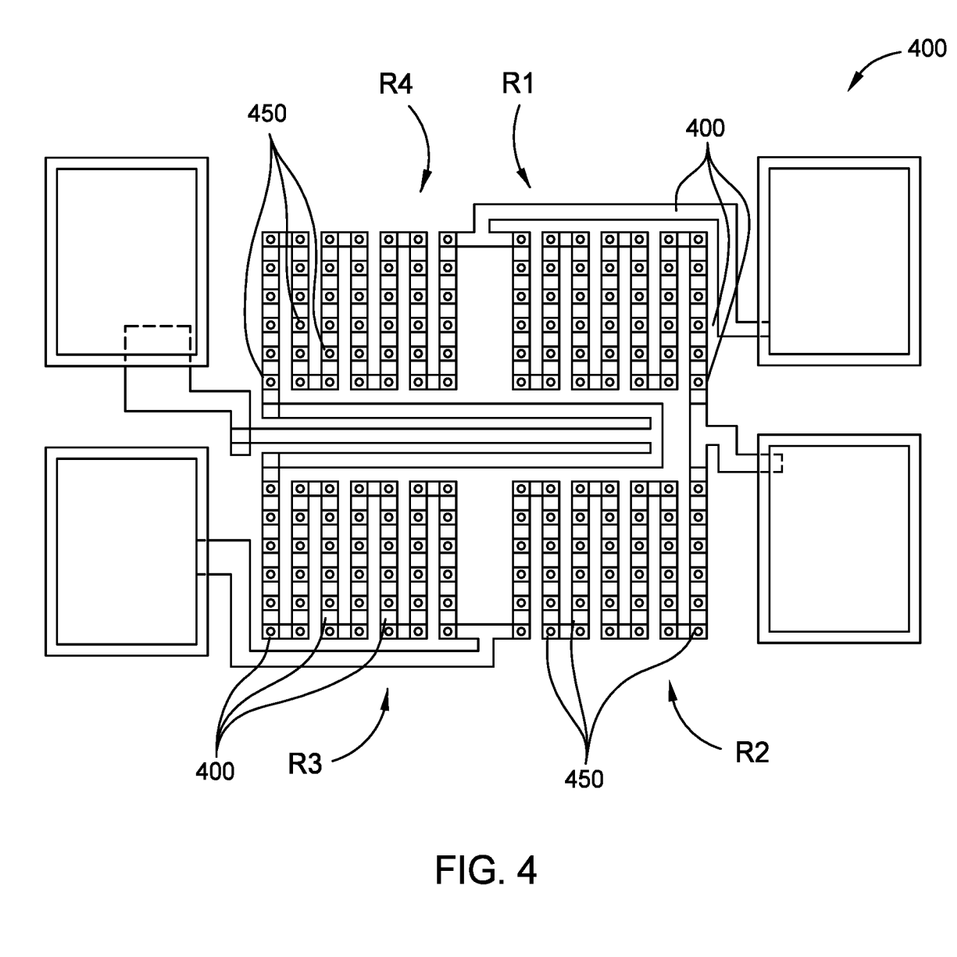
FIG. 4 is a schematic illustration of a Wheatstone bridge with multiple TMR structures for each resistor.

FIG. 4 is a schematic illustration of a Wheatstone bridge 400 with multiple TMR structures for each resistor R1, R2, R3, R4. R1 may correspond to resistor 304; R2 may correspond to resistor 306; R3 may correspond to resistor 310; and R4 may correspond to resistor 308. When the working field bias is set to 0, then R1=R2=R3=R4. Additionally, the resistors R1 and R3 are distinct from resistors R2 and R4 based upon the TMR structures to provide two different magnetoresistances responses.

In the Wheatstone bridge 400, each resistor R1, R2, R3, R4 includes a plurality of TMR structures 400, 450. More specifically, in one embodiment, resistors R1 and R3 will include a plurality of TMR structures 400 and resistors R2 and R4 will include a plurality of TMR structures 450. In another embodiment, resistors R1 and R3 will include a plurality of TMR structures 450 and resistors R2 and R4 will include a plurality of TMR structures 400. For simplicity, FIG. 4 illustrates resistors R1 and R3 having TMR structures 400 while resistors R2 and R4 have TMR structures 450. The TMR structures 400, 450 in resistors R1 and R3 are identical in both number and design. Similarly, the TMR structures 400, 450 in resistors R2 and R4 are identical in both number and design.

The typical magnetic field sensor uses MR devices in a Wheatstone bridge circuit. A key is to make the MR change differently in the bridge. Herein, the magnetic field sensor has an adjustable bias point. Two different sets of TMR structures 400, 450 have with two different magnetoresistance responses. Both TMR structures 400, 450 have free layer and pinned layer magnetic moments that are orthogonal to each other, but the magnetoresistance responses are reversed (i.e., one TMR structure has resistance increasing while the other has resistance decreasing linearly with the external magnetic field). Additionally, the bias point can be adjusted to operate within a given external magnetic field range.

Figure 5A:
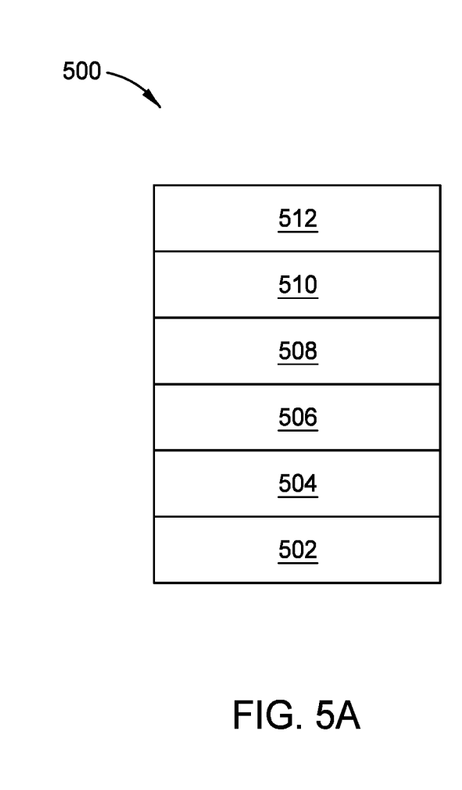
FIG. 5A is a schematic illustration of a TMR device according to one embodiment.

FIG. 5A is a schematic illustration of a TMR device 500 according to one embodiment. In certain embodiments, the TMR device may be incorporated into the aforementioned magnetic read head of a magnetic recording disk drive or the Wheatstone bridge. The TMR device 500 comprises of a bottom shield (S1) 502, a high radiation reflective layer 504, a lower seed layer 506, an upper seed layer 508, a TMR sensor 510, and a top shield (S2) 512. The bottom shield 502 and top shield 512 may be comprised of a nickel iron (NiFe) layer. The bottom shield 502 may be disposed on an aluminum titanium carbide (AlTiC) layer.

The high radiation reflective layer 504 comprises of copper (Cu), silver (Ag), gold (Au), or combinations thereof. The reflective layer 504 may insulate the substrate allowing for the temperature of the substrate to be more consistent. The reflective layer 504 may have a thickness of about 50 nm to 600 nm. The high radiation reflective layer 504 may be formed on the bottom shield 502.

The magnetic seed layers may comprise a single layer or multiple layers as shown in FIG. 5A. For example, when a multilayer seed layer is utilized, the lower seed layer 506 may comprise tantalum (Ta) or NiFe. The upper seed layer 508 may comprise ruthenium or copper. More specifically, in one embodiment, the lower seed layer 506 comprises NiFe and the upper seed layer 508 comprises Ru. In another embodiment, the lower seed layer 506 comprises tantalum and the upper seed layer 508 comprises ruthenium. In still another embodiment, the lower seed layer 506 comprises tantalum and the upper seed layer 508 comprises copper. Any of the combinations of lower seed layer 506 and upper seed layer 508 may be used in a Wheatstone bridge assembly. However, for a magnetic read head, the lower seed layer cannot be tantalum.

The upper seed layer 508 may have a greater thickness than the lower seed 506. The lower seed layer 506 is disposed on the reflective layer 504. The seed layers may contribute to a more uniform distribution of the molecular structure of the layers formed on top of the seed layers. The seed layers 506, 508 may have a thickness of between about 10 Å to about 300 Å and may be deposited by well-known deposition methods such a electroplating, electroless plating, or sputtering. For a magnetic read head, ferromagnetic materials, such as NiFe, are used as the lower seed layer 506 and may have a thickness of between about 200 Å and about 300 Å. For the magnetic read head, nonmagnetic material for the lower seed layer 506, such as Ta, is not applicable due to shield spacing requirements. In regards to a Wheatstone bridge resistor, any of the lower seed layer 506/upper seed layer 508 combinations are applicable. Additionally, it is to be understood that while Ru, Ta, NiFe, and Cu have been exemplified as the seed layer 506, 508 materials, other materials are contemplated and the embodiments discussed herein are not limited to Ru, Ta, NiFe, and Cu for the seed layers 506, 508.

Figure 5B:
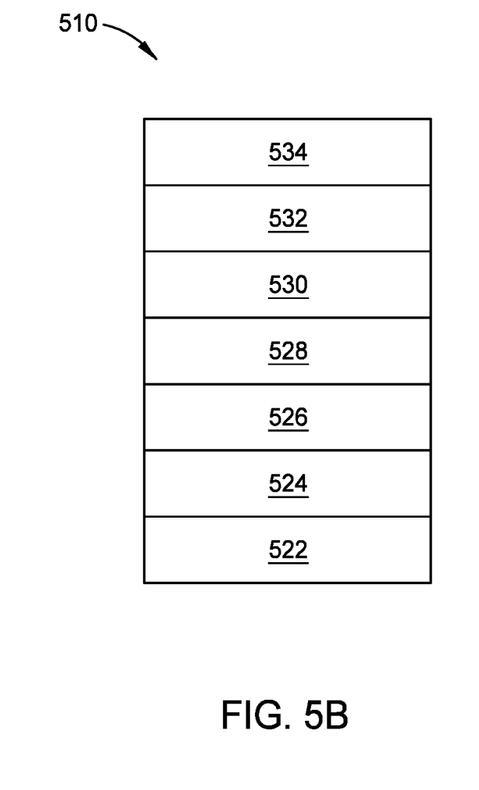
FIG. 5B is a schematic illustration of TMR sensor of FIG. 5A.

FIG. 5B is a schematic illustration of TMR sensor 510 of FIG. 5A. The TMR sensor 510 comprises of an antiferromagnetic (AFM) layer 522, a first pinned layer 524, an AFM spacer layer 526, a second pinned layer 528, a barrier layer 530, a free layer 532, and a cap layer 534. The TMR sensor 510 may be used as a part of the magnetic recording head 200 of FIG. 2 or used in the Wheatstone bridge sensor 400 of FIG. 4.

The AFM layer 522 may be composed of IrMn or PtMn and have a thickness between about 40 Å and about 500 Å. Additionally, it is to be understood that while IrMn and PtMn have been exemplified as the AFM layer 522 materials, other materials are contemplated and the embodiments discussed herein are not limited to IrMn or PtMn for the AFM layer 522. The AFM layer 522 may be formed by well-known deposition methods such as sputtering. The AFM layer 522 may have little to no magnetic moments due to the arrangement of ions within the compound. The AFM layer 522 may be disposed on an upper seed layer such as upper seed layer 508 of FIG. 5A.

The pinned layers 524, 528 may be composed of cobalt iron (CoFe) with a thickness of between about 20 Å and about 30 Å. The pinned layers 524, 528 may also be composed of a Co/CoFe/Co multi-layer stack. The pinned layers 524, 528 may be formed by well-known deposition methods such as sputtering. Additionally, it is to be understood that while CoFe or Co/CoFe/Co have been exemplified as the pinned layers 524, 528 material, other materials are contemplated and the embodiments discussed herein are not limited to CoFe or Co/CoFe/Co for the pinned layers 524, 528. The pinned layer 524 is disposed on the AFM layer 522. The pinned layer 528 is disposed under the barrier layer 530.

Between the two pinned layers 524, 528, an AFM spacer layer 526 is present. The AFM spacer layer 526 may comprise ruthenium (Ru), rhodium (Rh), or iridium (Ir) at a thickness of about 4 Å to about 10 Å. The AFM spacer layer 526 may be formed by well-known deposition methods such as sputtering. Additionally, while Ru, Rh, and Ir have been exemplified as AFM spacer layer 526 materials, other materials are contemplated and the embodiments discussed herein are not limited to Ru, Rh, and Ir for the AFM spacer layer 526.

The barrier layer 530 may be deposited on the pinned layer 528. The barrier layer 530 may be composed of magnesium oxide (MgO). The barrier layer 530 may also comprise of $Al_2O_3$, $TiO_x$, MgZnO, ZnO, AlTiO, $HfO_x$, $ZrO_x$, or any combination of two or more of the previously listed compounds including MgO, where subscript x denotes a numeric value for the number of oxide ions to fulfill the requirements for a stable compound. The barrier layer 530 may have a thickness of between about 10 Å to about 20 Å. It is to be understood that while MgO, $Al_2O_3$, $TiO_x$, MgZnO, ZnO, AlTiO, $HfO_x$, $ZrO_x$, or any combination of two or more of the previously listed compounds are exemplified as the barrier layer 530 materials, other insulating materials are contemplated and the embodiments discussed herein are not limited to MgO, $Al_2O_3$, $TiO_x$, MgZnO, ZnO, AlTiO, $HfO_x$, $ZrO_x$, or any combination of two or more of the previously listed compounds for the barrier layer 530.

The free layer 532 is disposed on the barrier layer 530. Suitable materials for the free layer 532 include a CoFe/CoFeB/Ta/NiFe multilayer stack. The CoFe layer may have a thickness of between about 3 Å to about 10 Å. The CoFeB layer may have a thickness of between about 10 Å to about 20 Å. The Ta layer may have a thickness of between about 0.5 Å to about 2 Å. The NiFe layer may have a thickness of between about 3 Å to about 300 Å, such as between about 3 Å and about 10 Å or between about 10 Å and about 300 Å. The free layer 532 may be formed by well-known deposition methods such as sputtering. Additionally, it is to be understood that while CoFe/CoFeB/Ta/NiFe has been exemplified as the free layer 532 materials, other materials are contemplated and the embodiments discussed herein are not limited to CoFe/CoFeB/Ta/NiFe for the free layer 532. A capping layer 534 is formed over the free layer 532.

Figure 6:
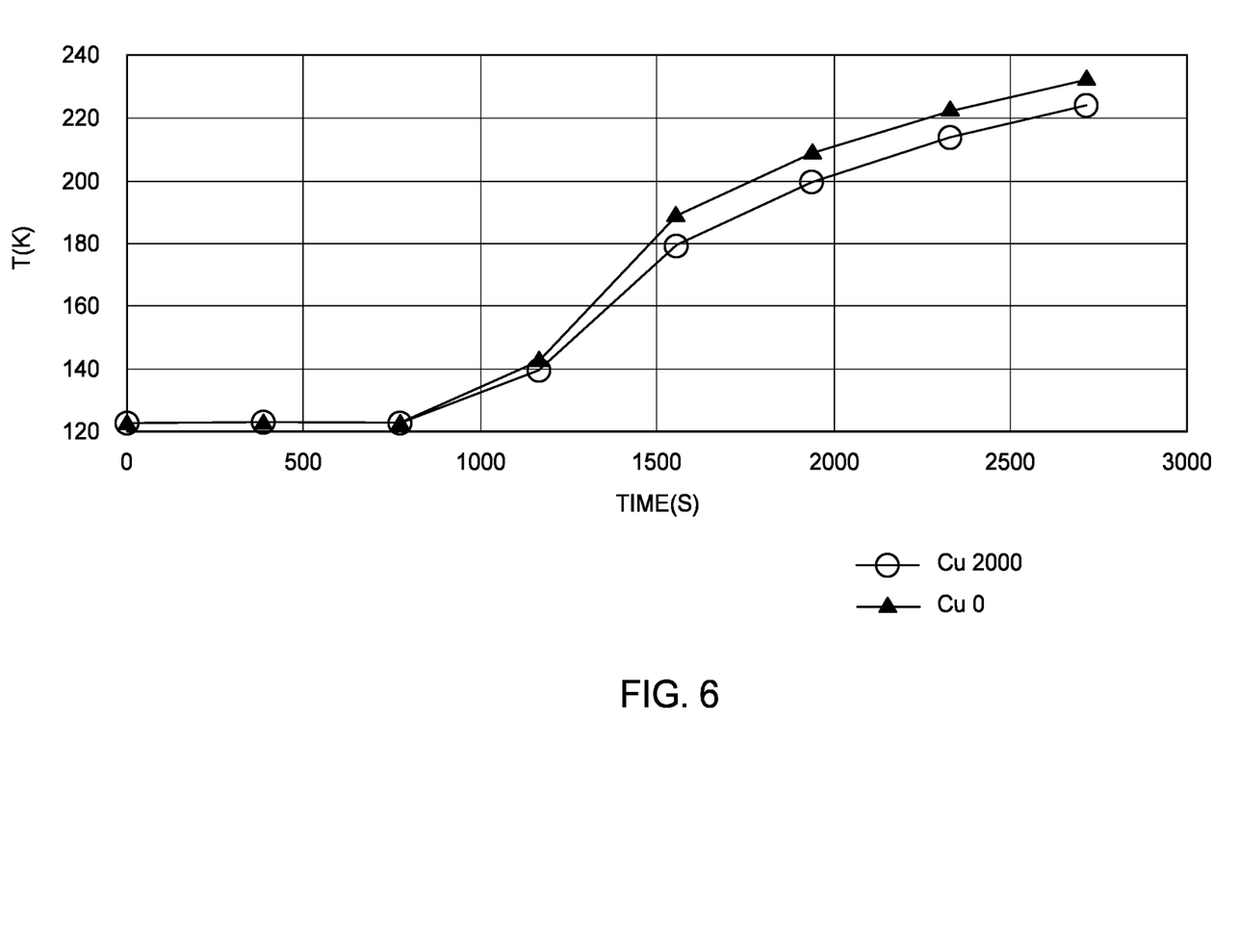
FIG. 6 is a graph illustrating the high radiation reflective layer on the substrate temperature after cooling.

FIG. 6 is a graph illustrating the high radiation reflective layer on the substrate temperature after cooling. In the embodiment illustrated in FIG. 6, the high radiation reflective layer 504 is copper (Cu). However, it is to be understood that the high radiation reflective layer 504 may be gold (Au) or silver (Ag). In another embodiment, the high radiation reflective layer 504 may be a combination of two or more materials such as Cu, Au, or Ag. The high radiation reflective layer 504 is disposed between the bottom shield 502 and the lower seed layer 506. For example, the high radiation reflective layer 504 may reflect the TMR device 500 in FIG. 5A.

Referring to FIG. 6, the y-axis is the substrate or the bottom shield temperature measured in Kelvin. The x-axis is the time that has passed since removing the wafer from the cooling chamber to transferring the wafer to the free layer deposition chamber. The graph compares two instances of TMR structure. The base case has no high radiation reflective layer. The tested case utilizes a copper high radiation reflective layer with a thickness of 2000 Å or 200 nm. It is contemplated that the high radiation reflective layer may have a thickness between about 50 nm to about 600 nm. After removing the wafer from the cooling chamber, the bottom shield 502 temperature will typically increase due to heat transfer from the ambient area. For both cases, the initial temperature of the substrates are similar. The base case of no high radiation reflective layer increases in temperature at a faster rate than that of a high radiation reflective layer thickness of greater than 0 nm, or in this instance, 200 nm. A high radiation reflective layer of a compound such as Ag or Au may result in similar trends. The inclusion of the high radiation reflective layer insulates the wafer from the heat transfer from the ambient area.

Figure 7:
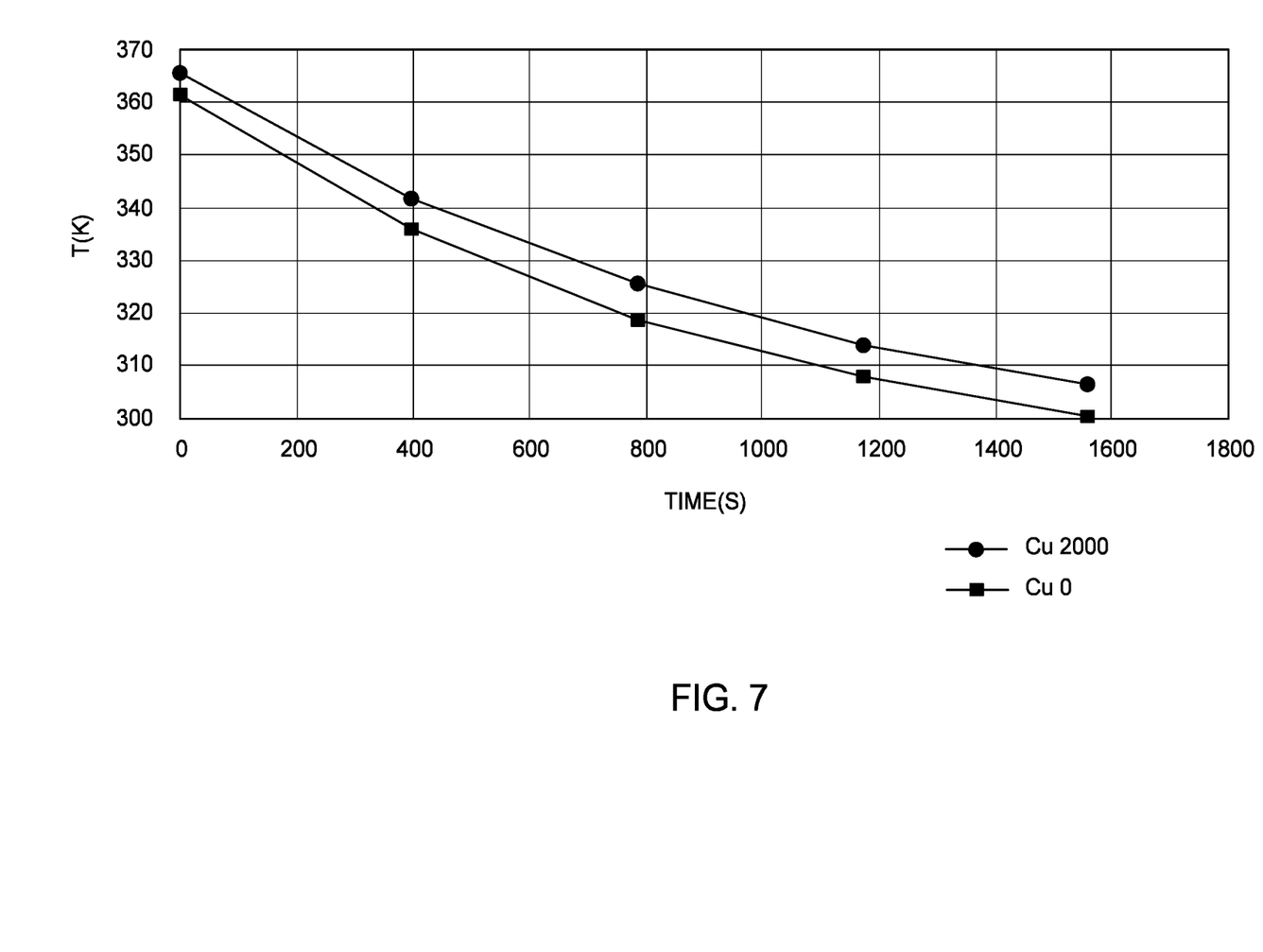
FIG. 7 is a graph illustrating the high radiation reflective layer on the substrate temperature after heating.

FIG. 7 is a graph illustrating the high radiation reflective layer on the substrate temperature after heating. In the embodiment illustrated in FIG. 7, the high radiation reflective layer 504 is copper (Cu). However, it is to be understood that the high radiation reflective layer 504 may be gold (Au) or silver (Ag). In another embodiment, the high radiation reflective layer 504 may be a combination of two or more materials such as Cu, Au, or Ag. The high radiation reflective layer 504 is disposed between the bottom shield 502 and the lower seed layer 506. For example, the high radiation reflective layer 504 may reflect the TMR device 500 in FIG. 5A.

Referring to FIG. 7, the y-axis is the substrate or the bottom shield temperature measured in Kelvin. The x-axis is the time that has passed since removing the substrate from the annealing chamber and inserting the substrate into another chamber. The graph compares two instances of a copper based high radiation reflective layer. The base case does not include a high radiation reflective layer. The tested case utilizes a copper high radiation reflective layer with a thickness of 2000 Å or 200 nm. It is contemplated that the high radiation reflective layer may have a thickness between about 50 nm to about 600 nm. After removing the substrate from the annealing chamber, the bottom shield 502 temperature will decrease due to heat transfer to the ambient area. For both cases, the initial temperature of the substrate are similar. However, the case without a high radiation reflective layer loses heat to the surroundings as soon as the substrate is removed from a chamber. The base case of no high radiation reflective layer decreases in temperature at a faster rate than that of a high radiation reflective layer thickness of greater than 0 nm, or in this instance, 200 nm. A high radiation reflective layer of a compound such as Ag or Au may result in similar trends. The inclusion of the high radiation reflective layer insulates the wafer from the heat transfer to the ambient area.

Figure 8:
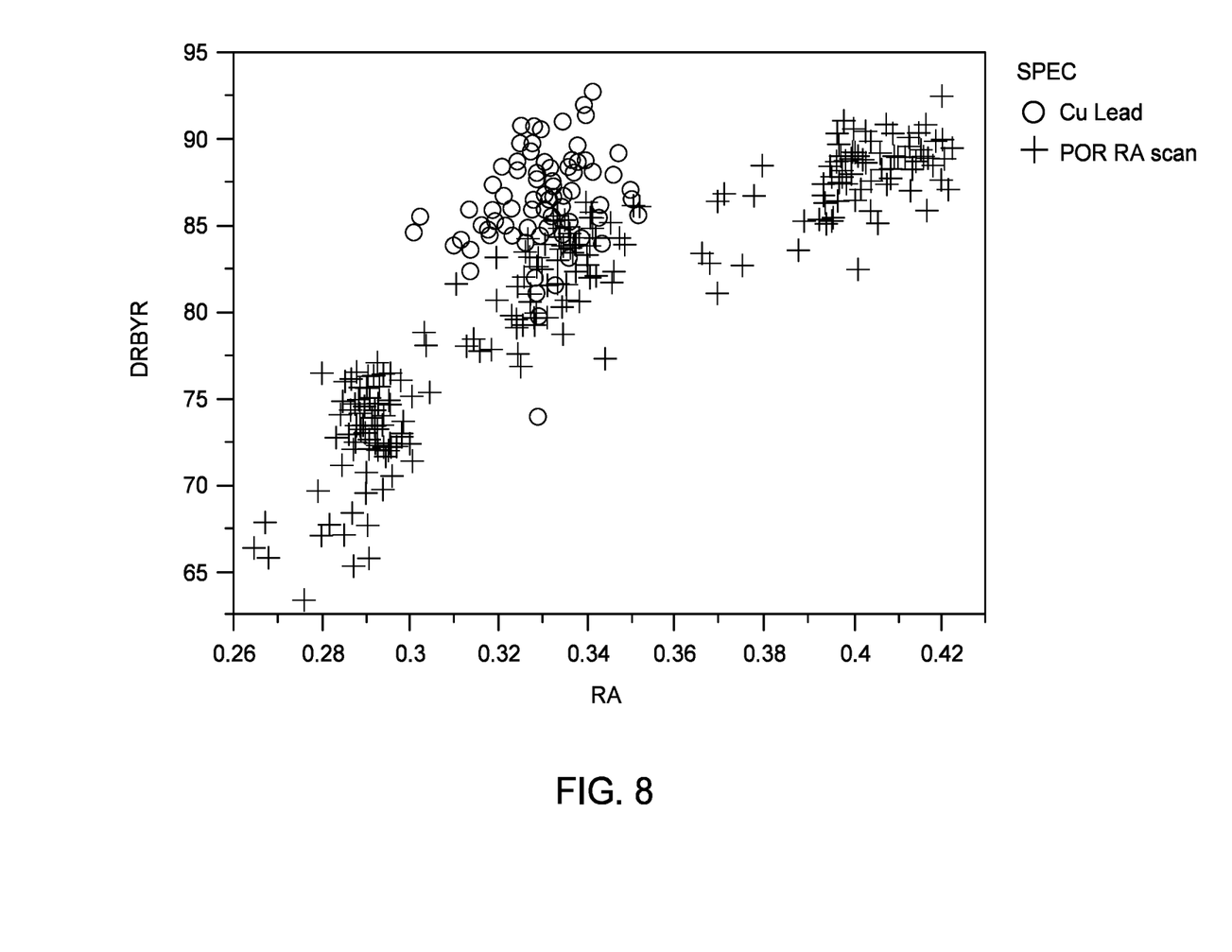
FIG. 8 is a schematic illustration of the impact of the high radiation reflective layer on the MR and RA.

FIG. 8 is a schematic illustration of the impact of the high radiation reflective layer on the MR and RA. The y-axis is the magnetic resistance (MR) of the substrate. The x-axis is the resistance area (RA) of the substrate. In FIG. 8, the point of reference (POR) RA scan shows a positive correlation between RA and MR. However, a Cu high radiation reflective layer results in a lower RA and a higher MR than the point of reference case. The ability to stabilize the temperature of the substrate after cooling may significantly increase MR. A lower RA and a higher MR may result in an increased sensor signal-to-noise ratio (SNR), which may decrease signal distortion. Furthermore, a lower RA may be achieved with the same barrier thickness which may result in a similar breakdown voltage in the Wheatstone bridge.

The table below illustrates the RA and MR improvement with using a copper layer between the lower shield and the seed layer. In each instance, a substrate comprising AlTiC/NiFe at 2 micrometers is utilized. In certain instances, a copper high radiation reflective layer is utilized between the lower shield and the seed layer. In some embodiments, no such high radiation reflective layer is present. In some situations, rapid thermal annealing (RTA) at 300 degrees Celsius occurs and in other situations a simple 200 degrees Celsius heating process occurs. In some situations, no cooling occurs while in others cryogenic cooling for 1300 seconds occurs. As shown in the table, the RA decreases with the high radiation reflective layer being present, and the MR generally increases with the presence of the high radiation reflective layer being present.

TABLE

| Example | Copper layer (Angstroms) | Heating | Cooling | RA | MR |
|---|---|---|---|---|---|
| 1 | 0 | RTA 300 Celsius | 0 | 0.27 | 30.7 |
| 2 | 2000 | RTA 300 Celsius | 0 | 0.17 | 30.35 |
| 3 | 0 | 200 Celsius | 1300 | 0.32 | 74.42 |
| 4 | 2000 | 200 Celsius | 1300 | 0.26 | 97.05 |
| 5 | 0 | RTA 300 Celsius | 1300 | 0.28 | 69.75 |
| 6 | 2000 | RTA 300 Celsius | 1300 | 0.19 | 81.33 |

In one embodiment, a TMR sensor device comprises: a first shield; a reflective layer disposed on the first shield; a magnetic seed layer disposed on the reflective layer, wherein the magnetic seed layer is distinct from the reflective layer and wherein the magnetic seed layer comprises one or more sublayers; a TMR sensor disposed on the magnetic seed layer; and a second shield disposed on the TMR sensor. The reflective layer comprises a material selected from the group consisting of copper, silver, gold, and combinations thereon. The reflective layer has a thickness of between about 50 nm and about 600 nm. The magnetic seed layer comprises a first sublayer comprising tantalum and a second sublayer comprising ruthenium or copper, wherein the first sublayer is disposed on the reflective layer. The second sublayer has a greater thickness than the first sublayer. The magnetic seed layer comprises a first sublayer comprising a magnetic material and a second sublayer comprising ruthenium, wherein the first sublayer is disposed on the reflective layer. The device is a magnetic recording head. The device is a Wheatstone bridge sensor. A magnetic recording device comprising a magnetic recording head including the TMR sensor device is also disclosed.

In another embodiment, a TMR sensor device comprises: a first layer comprising copper, silver, gold, or combinations thereof; a multilayer seed structure comprising at least one layer of copper that is distinct from the first layer, wherein the first layer has a thickness that is greater than a thickness of the at least one layer of copper in the multilayer seed structure, wherein the multilayer seed structure is disposed on the first layer; and a TMR sensor disposed on the multilayer seed structure. The first layer is spaced from the at least one layer of copper in the multilayer seed structure by a second layer of the multilayer seed structure. A thickness of the first layer is greater than a thickness of the at least one layer of copper. The device is a magnetic recording head. The device is a Wheatstone bridge sensor. A magnetic recording device comprising a magnetic recording head including the TMR sensor device is also disclosed.

In another embodiment, a TMR sensor device comprises: a first shield; means to stabilize a temperature of the TMR sensor device, wherein the means to stabilize a temperature of the TMR sensor device is disposed on the first shield; a magnetic seed layer disposed on the means to stabilize the temperature of the TMR sensor device; a TMR sensor disposed on the magnetic seed layer; and a second shield disposed on the TMR sensor. A resistance area (RA) of the TMR sensor device including the means to stabilize is lower than the RA of the TMR sensor device in which the means to stabilize is not present. A magnetoresistance (MR) of the TMR sensor device including the means to stabilize is higher than the MR of the TMR sensor device in which the means to stabilize is not present. The device is a magnetic recording head. The device is a Wheatstone bridge sensor.

By utilizing a high radiation reflective layer in the TMR device between the lower shield and the magnetic seed layer, the MR can be increased, the RA can be decreased, and the substrate temperature can be stabilized during substrate transport.

While the foregoing is directed to embodiments of the present disclosure, other and further embodiments of the disclosure may be devised without departing from the basic scope thereof, and the scope thereof is determined by the claims that follow.

What is claimed is:

1. A tunnel magnetoresistive (TMR) sensor device, comprising:
   a first shield;
   a reflective layer disposed on the first shield, wherein the reflective layer has a thickness of between about 50 nm and about 600 nm;
   a magnetic seed layer disposed on the reflective layer, wherein the magnetic seed layer is distinct from the reflective layer, and wherein the magnetic seed layer comprises one or more sublayers;
   a TMR sensor disposed on the magnetic seed layer; and
   a second shield disposed on the TMR sensor.

2. The TMR sensor device of claim 1, wherein the reflective layer comprises a material selected from the group consisting of copper, silver, gold, and combinations thereon.

3. A magnetic recording head comprising the TMR sensor device of claim 1.

4. A Wheatstone bridge sensor comprising the TMR sensor device of claim 1.

5. A magnetic recording device comprising a magnetic recording head including the TMR sensor device of claim 1.

6. A tunnel magnetoresistive (TMR) sensor device, comprising:
   a first shield;
   a reflective layer disposed on the first shield;
   a magnetic seed layer disposed on the reflective layer, wherein the magnetic seed layer is distinct from the reflective layer, and wherein the magnetic seed layer comprises one or more sublayers;
   a TMR sensor disposed on the magnetic seed layer; and a second shield disposed on the TMR sensor, wherein the magnetic seed layer comprises a first sublayer comprising tantalum and a second sublayer comprising ruthenium or copper, wherein the first sublayer is disposed on the reflective layer.

7. The TMR sensor device of claim 6, wherein the second sublayer has a greater thickness than the first sublayer.

8. A tunnel magnetoresistive (TMR) sensor device, comprising:
a first shield;
a reflective layer disposed on the first shield;
a magnetic seed layer disposed on the reflective layer, wherein the magnetic seed layer is distinct from the reflective layer, and wherein the magnetic seed layer comprises one or more sublayers;
a TMR sensor disposed on the magnetic seed layer; and
a second shield disposed on the TMR sensor, wherein the magnetic seed layer comprises a first sublayer comprising a magnetic material and a second sublayer comprising ruthenium, wherein the first sublayer is disposed on the reflective layer.

9. A tunnel magnetoresistive (TMR) sensor device, comprising:
a first layer comprising copper, silver, gold, or combinations thereof;
a multilayer seed structure comprising at least one layer of copper that is distinct from the first layer, wherein the first layer has a thickness that is greater than a thickness of the at least one layer of copper in the multilayer seed structure, wherein the multilayer seed structure is disposed on the first layer; and
a TMR sensor disposed on the multilayer seed structure.

10. The TMR sensor device of claim 9, wherein the first layer is spaced from the at least one layer of copper in the multilayer seed structure by a second layer of the multilayer seed structure.

11. The TMR sensor device of claim 10, wherein a thickness of the first layer is greater than a thickness of the at least one layer of copper.

12. A magnetic recording head comprising the TMR sensor device of claim 9.

13. A Wheatstone bridge sensor comprising the TMR sensor device of claim 9.

14. A magnetic recording device comprising a magnetic recording head including the TMR sensor device of claim 9.

15. A tunnel magnetoresistive (TMR) sensor device, comprising:
a first shield;
means to stabilize a temperature of the TMR sensor device, wherein the means to stabilize a temperature of the TMR sensor device is disposed on the first shield;
a magnetic seed layer disposed on the means to stabilize the temperature of the TMR sensor device, wherein the magnetic seed layer comprises a first sublayer comprising tantalum and a second sublayer comprising ruthenium or copper;
a TMR sensor disposed on the magnetic seed layer; and
a second shield disposed on the TMR sensor.

16. The TMR sensor device of claim 15, wherein a resistance area (RA) of the TMR sensor device including the means to stabilize is lower than the RA of the TMR sensor device in which the means to stabilize is not present.

17. The TMR sensor device of claim 15, wherein a magnetoresistance (MR) of the TMR sensor device including the means to stabilize is higher than the MR of the TMR sensor device in which the means to stabilize is not present.

18. A magnetic recording head comprising the TMR sensor device of claim 15.

19. A Wheatstone bridge sensor comprising the TMR sensor device of claim 15.

20. The TMR sensor device of claim 15, wherein the first sublayer is disposed on a reflective layer.

21. The TMR sensor device of claim 15, wherein the second sublayer has a greater thickness than the first sublayer.

22. The TMR sensor device of claim 15, wherein the means to stabilize the temperature of the TMR sensor device is distinct from the magnetic seed layer.

* * * * *